US005593912A

United States Patent [19]
Rajeevakumar

[11] Patent Number: 5,593,912
[45] Date of Patent: Jan. 14, 1997

[54] SOI TRENCH DRAM CELL FOR 256 MB DRAM AND BEYOND

[75] Inventor: Thekkemadathil V. Rajeevakumar, Scarsdale, N.Y.

[73] Assignee: International Business Machines Corporation, Armonk, N.Y.

[21] Appl. No.: 319,833

[22] Filed: Oct. 6, 1994

[51] Int. Cl.$^6$ .................................. H01L 21/8242
[52] U.S. Cl. ........................ 437/52; 437/47; 437/60
[58] Field of Search ........................ 437/26, 47, 48, 437/52, 60, 203, 238; 257/301

[56] References Cited

U.S. PATENT DOCUMENTS

| | | | |
|---|---|---|---|
| 4,326,332 | 4/1982 | Kenney | 437/203 |
| 5,001,526 | 3/1991 | Goutou | 357/23.6 |
| 5,096,849 | 3/1992 | Beilstein et al. | 437/67 |
| 5,182,224 | 1/1993 | Kim et al. | 437/52 |
| 5,204,286 | 4/1993 | Doan | 437/193 |
| 5,214,603 | 5/1993 | Dhong et al. | 365/207 |
| 5,262,002 | 11/1993 | Grewal et al. | 156/657 |
| 5,283,453 | 2/1994 | Rajeevakumar | 257/304 |
| 5,360,758 | 11/1994 | Brommer | 437/52 |
| 5,422,294 | 6/1995 | Noble, Jr. | 437/52 |

OTHER PUBLICATIONS

N.C.C. Lu et al, IEEE J. Solid–State Circuits V. SC–21 (1986) p. 627 "A Substrate–Plate Trench–Capacitor (SPT) Memory Cell for Dynamic RAMs".

*Primary Examiner*—Tom Thomas
*Attorney, Agent, or Firm*—Robert P. Tassinari, Jr.

[57] ABSTRACT

A trench SOI structure is described. The structure is useful, for instance in the fabrication of DRAM cells. The structure can be fabricated by extending the conventional substrate plate trench cell. The SOI cell eliminates the parasitic trench sidewall leakage, reduces soft errors, eliminates well to substrate leakage, in addition to all the other advantages of SOI devices.

5 Claims, 6 Drawing Sheets

SOI TRENCH DRAM CELL FOR 256 MB DRAM AND BEYOND

FIELD OF THE INVENTION

The invention relates to silicon on insulator (SOI) devices, and in particular to an SOI trench DRAM cell.

BACKGROUND

Silicon on Insulator (SOI) devices are very attractive for high performance VLSI. Thin film SOI devices have advantages such as improved short channel effects and subthreshold slope, higher mobility, freedom from latch-up, reduced parasitic capacitances and reduced power. In the past, fabrication of radiation-hardened devices was the first commercial application of SOI. This use developed from work aimed at replacing expensive silicon on sapphire for military radiation-hardened devices. The most advanced commercial product in this arena now is SRAM (256 Kb). Up to now, however, use of SOI for the fabrication of DRAM has not been believed to be practical.

One drawback of the SOI DRAM is the high cost of SOI wafers. In addition, fabricating an SOI DRAM cell is significantly complex compared to conventional DRAM cells. It is very difficult to etch trenches in conventional SOI substrates because trenches are normally etched using oxide masks. As a result, DRAM cells on SOI substrates use stacked capacitors placed above the oxide insulator of the SOI substrate. Stacked capacitors inherently have low storage capacitance, and introduce planarization problems. Further, the prior art SOI DRAM cells, which include stacked capacitor storage nodes, suffer from such drawbacks as parasitic sidewall leakage, high soft error rates, and well-to-substrate leakage.

SUMMARY OF THE INVENTION

Disclosed herein is an SOI DRAM cell extended from the substrate plate trench (SPT) cell, and a method for making the same.

It is an object of the invention to provide an SOI DRAM cell that can be manufactured using inexpensive, conventional wafers.

It is a further object of the present invention to provide a method for manufacturing an SOI DRAM cell without significantly increasing the process complexity, compared to conventional DRAM.

It is a further object of the invention to provide an SOI DRAM cell that eliminates parasitic trench sidewall leakage, reduces soft errors, and eliminates the well-to-substrate leakage associated with prior art stacked capacitor DRAM cells.

The invention is a trench structure having application as a trench storage capacitor for an SOI DRAM device. The trench capacitor is disposed below a wafer insulator (oxide) and an access device is disposed above the insulator oxide.

FIGURES

DETAILED DESCRIPTION

Figure 1:
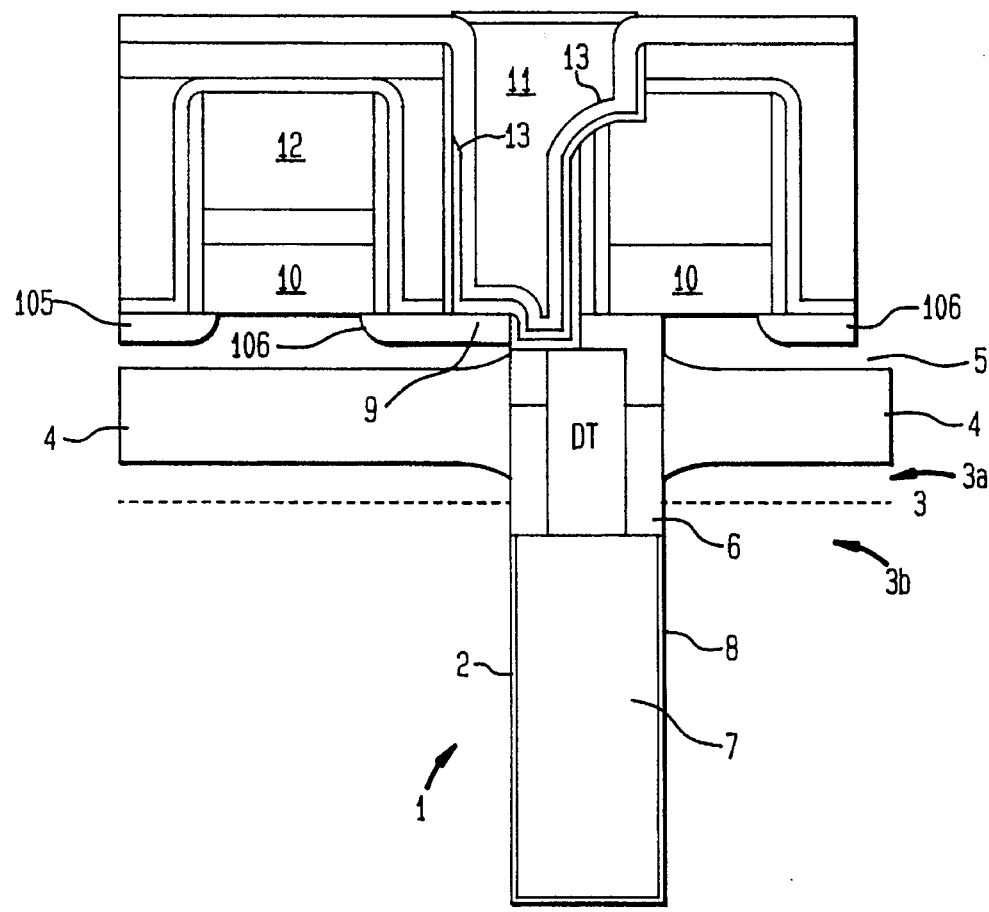
FIG. 1 is a cross-sectional view of an SOI trench DRAM cell in accordance with the invention.

A basic DRAM cell structure in which the structure and method of the present invention are useful is shown in FIG. 1. An oxide band 4 is fabricated under the source/drain 105/106 and the device 10 as shown. The oxide band 4 is continuous for an array of DRAM cells and isolates the device's array-well 5 from the substrate. The oxide band completely eliminates the well-to-substrate leakage. Note that any parasitic trench sidewall leakage is also completely eliminated by means of the oxide band 4 completely isolating the source/drain from the substrate. As seen in FIG. 1, the structure comprises an SOI substrate 1, a deep trench 2, an oxide band 4 separating the device from the substrate 1, array well 5, an oxide collar 6 around the trench, polysilicon fill 7 inside the deep trench 2, trench capacitor node dielectric 8, device diffusion 9, gate poly 10, strap poly fill 11, gate conductor cap 12, and surface strap 13. Above the line denoted as 3 is a thin epi layer 3a and below line 3 is a low resistance substrate 1.

The cell structure above the oxide band 4 need not be restricted to the specific cell shown in FIG. 1. The thickness of oxide band 4 can be controlled and specified by the process parameters. A thinner oxide band produces lower vertical stress. In general, an oxide band thickness of 200 Angstroms to 500 Angstroms is preferred.

Process Details

Figure 2:
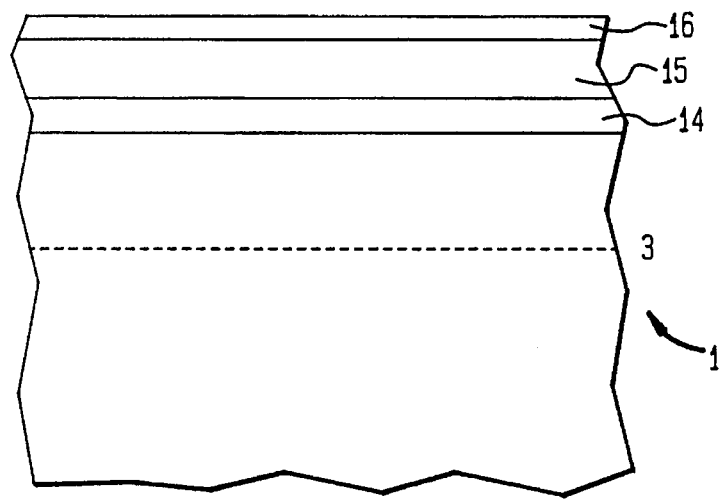
FIGS. 2–11 depict various stages in the process of fabricating a trench structure useful for the DRAM structure of FIG. 1.
Figure 3:
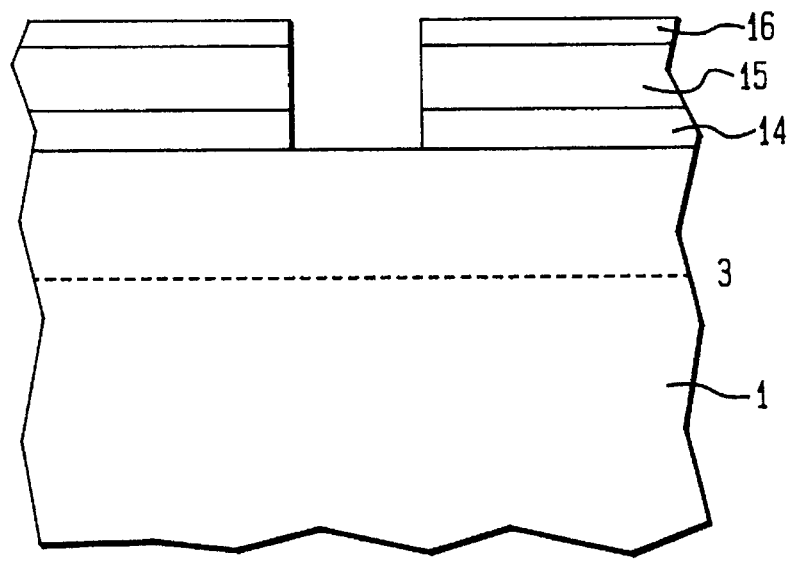
Figure 4:
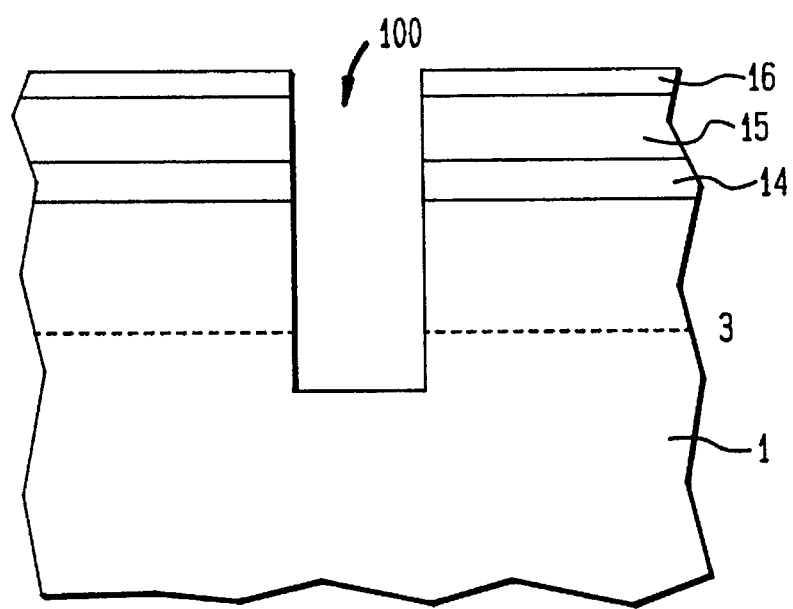
Figure 5:
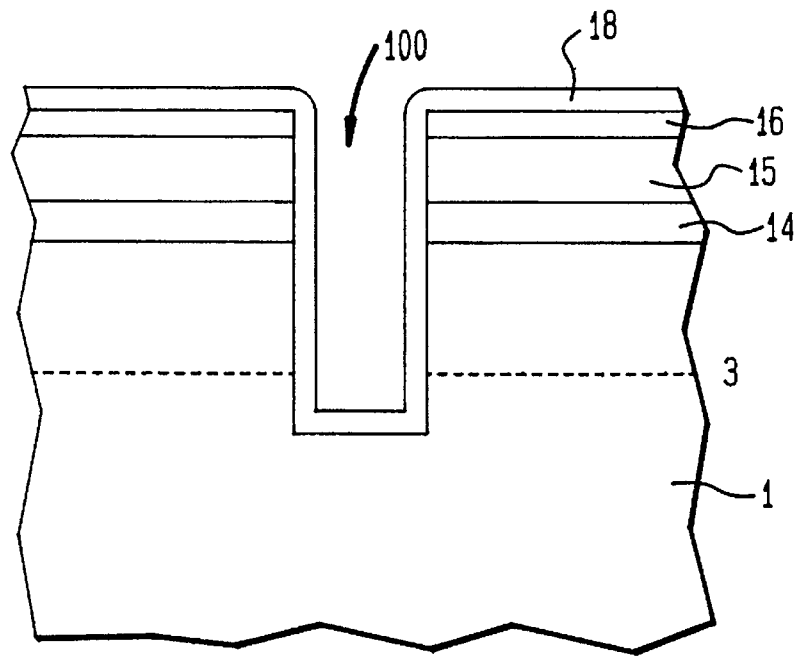
Figure 6:
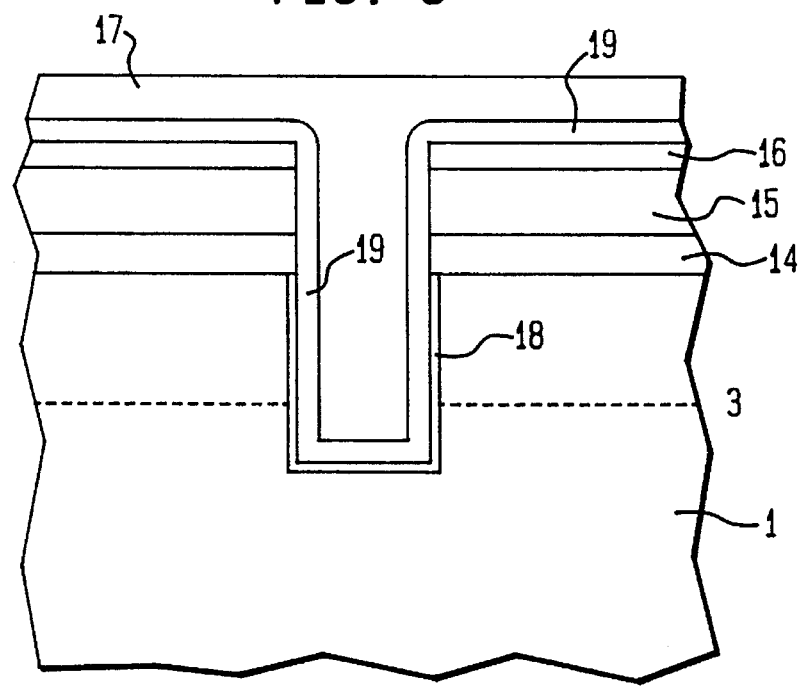

Referring now to FIG. 2, a preferred method of fabricating the SOI trench structure of the present invention will be described. In FIG. 2, 14 is a thin deposited nitride layer, 15 is a deposited oxide layer, and 16 is another thin deposited nitride layer. The nitride/oxide/nitride layer 14, 15, 16 in FIG. 2 is then patterned using trench mask, FIG. 3. The nitride/oxide/nitride layer 14, 15, 16 is used as a mask to etch trench 100 in silicon 1 using reactive ion etching. Next, the trench 100 is RIE'ed to a depth of about 0.5 μm to 0.6 μm into the silicon substrate 1, FIG. 4. This depth is more than the expected source/drain junction depth. Next, as shown in FIG. 5, a thin layer of thermal oxide 18 is grown on the silicon surfaces of the structure and in the trench. Next, a layer of nitride 19 is deposited and planarization resist 17 is then spun on to the wafer, resulting in the structure of FIG. 6.

Figure 7:
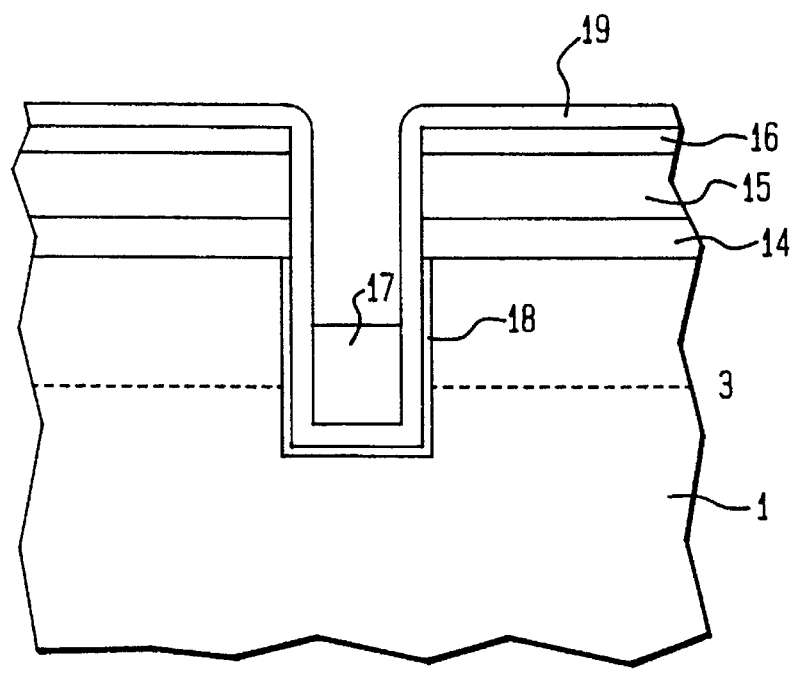
Figure 8:
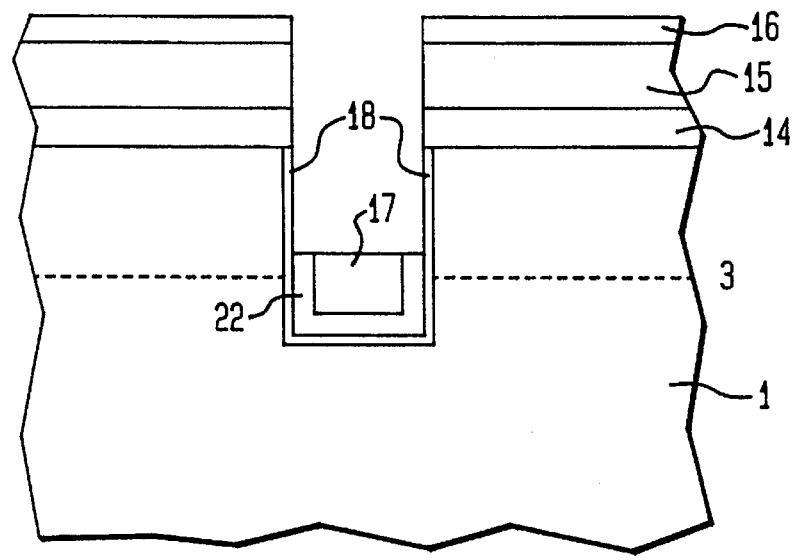
Figure 9:
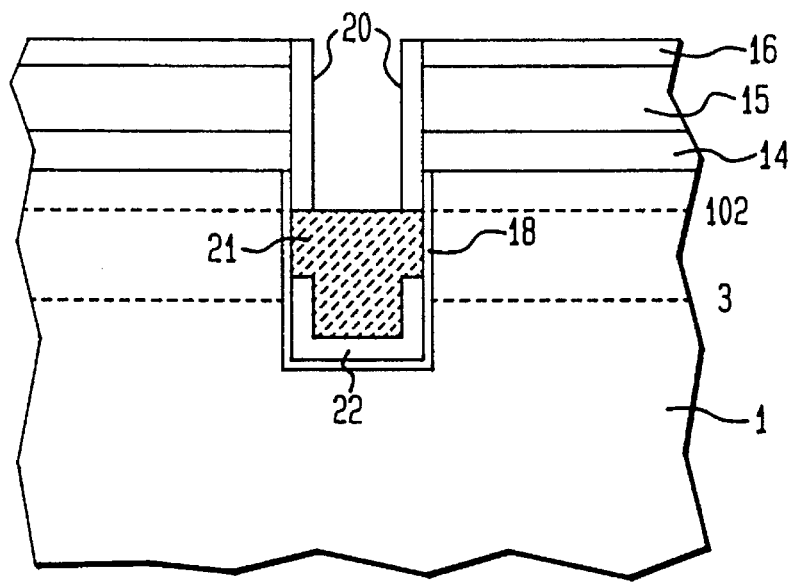

Next, referring to FIG. 7, the planarization resist is recessed by blanket RIE to a level above the well depth. The exposed nitride layer 19 is isotropically etched to leave a lower nitride barrier 22, as shown in FIG. 8. The remaining planarization resist 17 is then removed with any suitable solvent, and the trench is filled with intrinsic polysilicon 21 by deposition, and planarized and polished by chemical-mechanical polishing. The polysilicon 21 is then recessed to a depth 102, which is below the source/drain junction depth. Nitride collars 20 are then formed around the trench, resulting in the structure as shown in FIG. 9. The collars are formed by depositing a nitride layer on the substrate, followed by anisotropic etching of the deposited nitride lying on the horizontal surfaces of the structure and trench.

Figure 10:
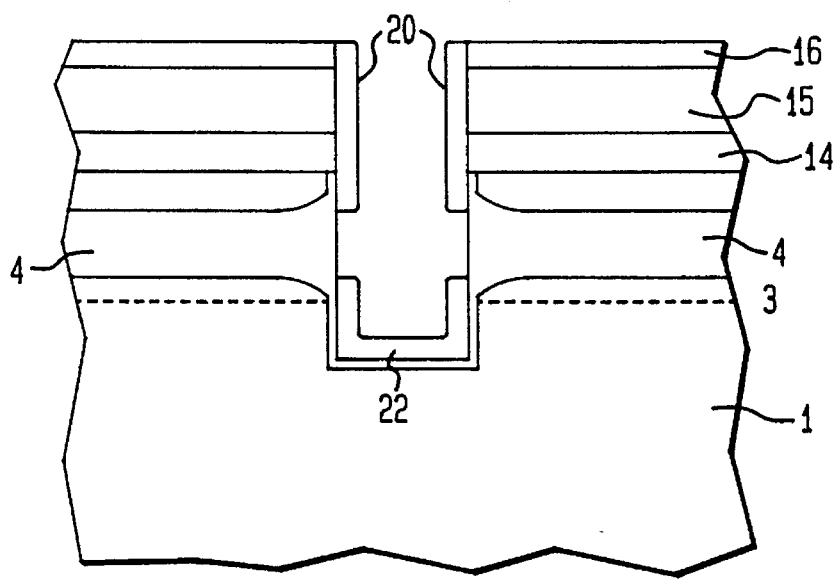

The exposed polysilicon 21 is then isotropically etched selective to oxide. The silicon that is not protected either by nitride collar 20 or nitride barrier 22 is then oxidized to form the oxide band 4 around the trench in the array area, as shown in FIG. 10. For a 256 Mb DRAM chip, the spacing between the trenches are about 0.25 μm. The oxidation time is adjusted, therefore, so that the oxide band 4 extends more than 0.15 μm laterally into the substrate to ensure a continuous oxide band under the device in the memory array.

Figure 11:
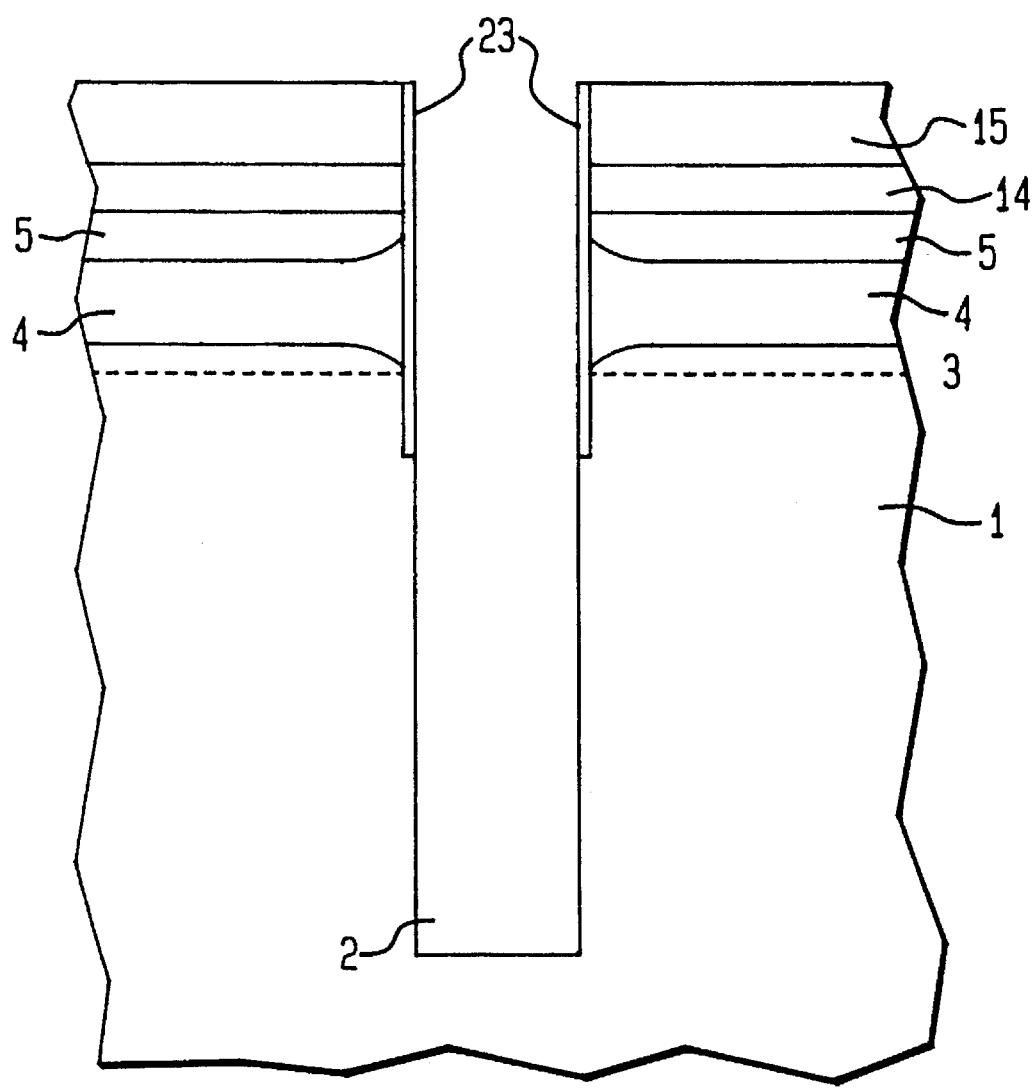

Any protruding oxide remaining inside the trench following the oxidation step, as well as oxide layer 16, are anisotropically etched and removed. The exposed nitride areas 20 and 22 are then isotropically etched. A thin nitride collar 23 (FIG. 10) is then formed around the trenches to protect the oxide band. The collars are formed by depositing a thin layer of nitride on the entire structure, followed by anisotropic etching of the nitride from the horizontal surfaces of the structure and the trench. The trenches are then further etched to the desired depth, resulting in the structure of FIG. 11.

Conventional steps can then be used to continue processing to fabricate the structure shown in FIG. 1.

I claim:

1. A method for fabricating a silicon-on-insulator ("SOI") trench structure, comprising:

providing an SOI substrate having an insulator layer and a silicon layer on the insulator layer;

etching a trench in the substrate, the trench extending through the silicon layer into the insulator layer;

forming an oxide layer on the walls of the trench;

forming a first masking layer on the oxide layer in the trench;

removing the first masking layer from an upper portion of the trench above the insulator layer, and leaving a remaining portion of the masking layer in a lower portion of the trench;

forming a second masking layer on the remaining portion of the first masking layer and on a part of the trench above the remaining portion of the first masking layer;

forming a masking collar on the upper portion of the trench above the second masking layer;

removing the second masking layer to expose a band of the trench between the masking collar and the first masking layer;

oxidizing the exposed band of the trench to form an annular oxide region in the substrate below the surface thereof.

2. The method of claim 1, wherein the masking collar comprises nitride.

3. The method of claim 1, wherein the first masking layer comprises nitride.

4. The method of claim 1, further comprising:

removing the masking collar and the remaining portion of the first masking layer;

forming a thin nitride layer on the trench wall surfaces;

extending the depth of the trench.

5. A method for fabricating a silicon-on-insulator ("SOI") trench structure, comprising:

providing an SOI substrate having an insulator layer and a silicon layer on the insulator layer;

etching a trench in the substrate, the extending through the silicon layer into the insulator layer;

forming an oxide layer on the walls of the trench;

forming a nitride masking layer on the oxide layer in the trench;

removing the nitride masking layer from an upper portion of the trench above the insulator layer, and leaving a remaining portion of the masking layer in a lower portion of the trench;

forming a second masking layer on the remaining portion of the nitride masking layer and on part of the trench above the remaining portion of the nitride masking layer;

forming a nitride masking collar on the upper portion of the trench above the second masking layer;

removing the second masking layer to expose a band of the trench between the masking collar and the nitride masking layer;

oxidizing the exposed band of the trench to form an annular oxide region in the substrate below the surface thereof;

removing the masking collar and the remaining portion of the nitride masking layer;

forming a thin nitride layer on the trench wall surfaces;

extending the depth of the trench.

* * * * *